US012652033B2

(12) United States Patent
Ryu et al.

(10) Patent No.: US 12,652,033 B2
(45) Date of Patent: Jun. 9, 2026

(54) DUTY CYCLE CORRECTION CIRCUIT

(71) Applicant: SK hynix Inc., Icheon-si (KR)

(72) Inventors: Chan Yang Ryu, Icheon-si (KR); Do Hyeon Kwon, Icheon-si (KR); Heon Ki Kim, Icheon-si (KR); Ji Young Lee, Icheon-si (KR); Jae Hyeong Hong, Icheon-si (KR); Ki Chang Gwon, Icheon-si (KR); Ji Hyeon Park, Icheon-si (KR); Sung Hwa Ok, Icheon-si (KR); Eun Ji Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/792,204

(22) Filed: Aug. 1, 2024

(65) Prior Publication Data

US 2025/0279774 A1 Sep. 4, 2025

(30) Foreign Application Priority Data

Feb. 29, 2024 (KR) ........................ 10-2024-0029809

(51) Int. Cl.
*H03K 5/156* (2006.01)
*G11C 7/22* (2006.01)
*H03K 3/017* (2006.01)
*H03K 5/135* (2006.01)
(52) U.S. Cl.
CPC ........... *H03K 5/1565* (2013.01); *G11C 7/222* (2013.01); *H03K 3/017* (2013.01); *H03K 5/135* (2013.01)

(58) Field of Classification Search
USPC .......................................... 327/149, 172–176
See application file for complete search history.

(56) References Cited

U.S. PATENT DOCUMENTS

| | | | | |
|---|---|---|---|---|
| 8,154,331 B2* | 4/2012 | Kim | .................... | H03K 5/1565 |
| | | | | 327/175 |
| 8,713,331 B2* | 4/2014 | Kitagawa | .............. | G11C 7/222 |
| | | | | 327/158 |
| 11,256,285 B2* | 2/2022 | Seo | ........................ | H03K 5/135 |
| 11,349,457 B2* | 5/2022 | Kim | ...................... | H03K 3/017 |
| 11,742,016 B2* | 8/2023 | Yoon | ..................... | G11C 7/222 |
| | | | | 365/149 |
| 12,074,602 B2* | 8/2024 | Park | ........................ | G06F 1/08 |

(Continued)

*Primary Examiner* — Thomas J. Hiltunen
(74) *Attorney, Agent, or Firm* — WILLIAM PARK AND ASSOCIATES LTD.

(57) ABSTRACT

A duty cycle correction circuit includes a phase adjustment circuit, a divider circuit, a phase difference detection circuit, and a duty control circuit. The phase adjustment circuit adjusts a duty cycle of a first input clock signal according to a plurality of control codes to generate a duty corrected clock signal. The divider circuit divides the duty corrected clock signal to generate a plurality of multi-phase clock signals. The phase difference detection circuit detects phase differences between the plurality of multi-phase clock signals to generate detection signals. The duty control circuit detects a bang-bang state of the duty corrected clock signal in accordance with the detection signals, changes values of the plurality of control codes by a first unit in accordance with the detection signals until the bang-bang state is detected, and adjusts the value of the plurality of control codes by a second unit smaller than the first unit when the bang-bang state is detected.

19 Claims, 5 Drawing Sheets

10

(56) References Cited

U.S. PATENT DOCUMENTS

| | | | |
|---|---|---|---|
| 12,231,528 B2 * | 2/2025 | Moon | G06F 1/04 |
| 12,341,524 B2 * | 6/2025 | An | H03L 7/0814 |
| 2020/0195240 A1 | 6/2020 | Lim et al. | |
| 2022/0140832 A1 * | 5/2022 | Song | H03L 7/0814 |
| | | | 327/158 |
| 2023/0360689 A1 | 11/2023 | Park et al. | |

* cited by examiner

DUTY CYCLE CORRECTION CIRCUIT

CROSS-REFERENCES TO RELATED APPLICATION

The present application claims priority under 35 U.S.C. § 119(a) to Korean Patent Application number 10-2024-0029809 filed on Feb. 29, 2024, in the Korean Intellectual Property Office, which application is incorporated herein by reference in its entirety.

BACKGROUND

1. Technical Field

Various embodiments generally relate to a semiconductor circuit, including but not limited to a duty cycle correction circuit.

2. Related Art

In semiconductor circuits that operate based on a clock signal, such as a semiconductor memory and CPU or GPU that controls the semiconductor memory, accurate control of a duty of the clock signal is very important. For example, in a semiconductor memory where data is input and output at rising and falling edges of the clock signal, when a duty of the clock signal is not exactly 50%, the timing between the rising and falling edges is incorrect, and data is not input and output at a correct time. A 50% duty of the clock signal indicates that a high level period of the clock signal has the same time period as a low level period of the clock signal. In various semiconductor circuits that operate based on the clock signal, a duty cycle correction circuit is essentially used to correct the duty of the clock signal.

SUMMARY

In an embodiment, a duty cycle correction circuit may include a phase adjustment circuit, a divider circuit, a phase difference detection circuit, and a duty control circuit. The phase adjustment circuit may be configured to adjust a duty cycle of a first input clock signal according to a plurality of control codes to generate a duty corrected clock signal. The divider circuit may be configured to divide the duty corrected clock signal to generate a plurality of multi-phase clock signals. The phase difference detection circuit may be configured to detect phase differences between the plurality of multi-phase clock signals to generate detection signals. The duty control circuit may be configured to detect a bang-bang state in accordance with the detection signals, may be configured to change values of the plurality of control codes by a first unit in accordance with the detection signals until the bang-bang state is detected, and may be configured to adjust the value of the plurality of control codes by a second unit smaller than the first unit when the bang-bang state is detected.

In an embodiment, a duty cycle correction circuit may include a phase adjustment circuit, a divider circuit, a phase difference detection circuit, and a duty control circuit. The phase mixing circuit may be configured to select at least one of a first clock signal and a second clock signal according to a different code set from a plurality of phase mixing control codes, and may be configured to mix selected signals to output a duty corrected clock signal. The divider circuit may be configured to divide the duty corrected clock signal to generate a plurality of multi-phase clock signals. The phase difference detection circuit may be configured to detect phase differences between the plurality of multi-phase clock signals to generate detection signals. The duty control circuit may be configured to detect a bang-bang state of the first duty corrected clock signal in accordance with the detection signals, may be configured to adjust values of the plurality of phase mixing control codes to maintain a complementary state among the plurality of phase mixing control codes in accordance with the detection signals until the bang-bang state is detected, and may be configured to adjust a value of at least one code bit among the plurality of phase mixing control codes when the bang-bang state is detected.

In an embodiment, a duty cycle correction circuit may include a first phase adjustment circuit, a second phase adjustment circuit, a divider circuit, a phase difference detection circuit, and a duty control circuit. The first phase adjustment circuit may be configured to adjust a duty cycle of a first input clock signal according to a plurality of delay control codes and a plurality of phase mixing control codes to generate a first duty corrected clock signal. The second phase adjustment circuit may be configured to adjust a duty cycle of a second input clock signal according to the plurality of delay control codes and the plurality of phase mixing control codes to generate a second duty corrected clock signal. The divider circuit may be configured to divide the first duty corrected clock signal and the second duty corrected clock signal to generate multi-phase clock signals. The phase difference detection circuit may be configured to detect phase differences of the multi-phase clock signals to generate detection signals. The duty control circuit may be configured to detect a bang-bang state in accordance with the detection signals, may be configured to change a value of the plurality of phase mixing control codes by a first unit in accordance with the detection signals until the bang-bang state is detected, and may be configured to adjust the value of the plurality of phase mixing control codes by a second unit less than the first unit when the bang-bang state is detected.

In an embodiment, a semiconductor apparatus may include a duty cycle correction circuit that may include a phase adjustment circuit configured to generate a duty corrected clock signal by adjusting a duty cycle of an input clock signal according to a plurality of control codes; and may include a duty control circuit configured to detect a bang-bang state of the duty corrected clock signal according to detection signals generated from a plurality of multi-phase clock signals based on the duty corrected clock signal, configured to change values of the plurality of control codes by a first unit until the bang-bang state is detected, and configured to adjust the values of the plurality of control codes by a second unit smaller than the first unit when the bang-bang state is detected.

BRIEF DESCRIPTION OF THE DRAWINGS

FIG. 4 is a diagram illustrating a duty cycle correction scheme according to an embodiment of the present disclosure.

DETAILED DESCRIPTION

Embodiments of the present disclosure are described in more detail with reference to the accompanying drawings. When one element is identified as "coupled" to another element, the elements may be coupled directly or through at least one intervening element between the elements. When two elements are identified as "directly coupled," one element is directly coupled to the other element without an intervening element between the two elements.

In various semiconductor circuits that operate based on the clock signal, a duty cycle correction circuit is essentially used to correct the duty of the clock signal. The duty cycle correction circuit adjusts a duty cycle by varying a value of a correction code. A duty cycle correction circuit often introduces a 1-bit code error due to the limitations of the correction circuit's resolution. The resolution refers to a phase adjustment ability of a correction code with respect to a unit code value. To solve this problem, the resolution may be increased, but increasing the resolution has undesirable effects of increased circuit area and power consumption.

Figure 1:
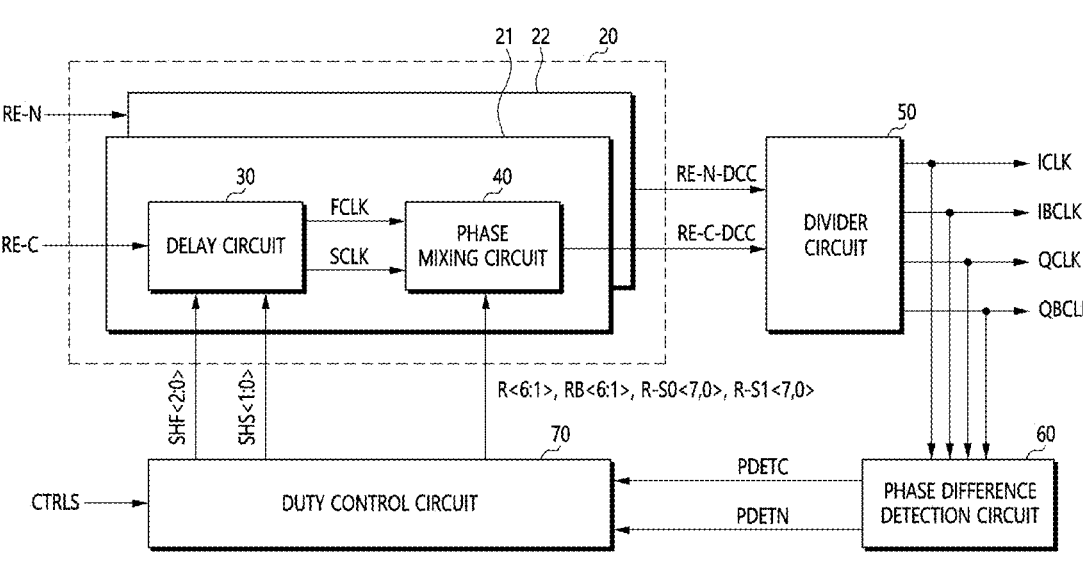
FIG. 1 is a diagram illustrating a configuration of a duty cycle correction circuit according to an embodiment of the present disclosure.

FIG. 1 is a diagram illustrating a configuration of a duty cycle correction circuit 10 according to an embodiment of the present disclosure.

Referring to FIG. 1, the duty cycle correction circuit 10 includes a phase adjustment circuit 20, a divider circuit 50, a phase difference detection circuit 60, and a duty control circuit 70.

The phase adjustment circuit 20 adjusts duty cycles of input clock signals RE-C, RE-N according to a plurality of control codes SHF<2:0>, SHS<1:0>, R<6:1>, RB<6:1>, R-S0<7,0>, R-S1<7,0> to generate duty corrected clock signals RE-C-DCC, RE-N-DCC. The input clock signals RE-C, RE-N may be clock signals received from a source external to the circuit in which the duty cycle correction circuit 10 is disposed, such as a memory control circuit 605, a data input/output circuit 604, a semiconductor circuit 600, or a device external to the semiconductor circuit 600.

The plurality of control codes SHF<2:0>, SHS<1:0>, R<6:1>, RB<6:1>, R-S0<7,0>, R-S1<7,0> include a plurality of delay control codes SHF<2:0>, SHS<1:0> and a plurality of phase mixing control codes R<6:1>, RB<6:1>, R-S0<7,0>, R-S1<7,0>. The plurality of delay control codes SHF<2:0>, SHS<1:0> include a first delay control code SHF<2:0> and a second delay control code SHS<1:0>. The plurality of phase mixing control codes R<6:1>, RB<6:1>, R-S0<7,0>, R-S1<7,0> include a first phase mixing control code set R<6:1>, RB<6:1> and a second phase mixing control code set R-S0<7,0>, R-S1<7,0>.

The input clock signals RE-C, RE-N include a first input clock signal RE-C and a second input clock signal RE-N.

The duty corrected clock signals RE-C-DCC, RE-N-DCC include a first duty corrected clock signal RE-C-DCC and a second duty corrected clock signal RE-N-DCC.

The phase adjustment circuit 20 includes a first phase adjustment circuit 21 and a second phase adjustment circuit 22.

The first phase adjustment circuit 21 adjusts a duty cycle of the first input clock signal RE-C according to the plurality of delay control codes SHF<2:0>, SHS<1:0> and the plurality of phase mixing control codes R<6:1>, RB<6:1>, R-S0<7,0>, R-S1<7,0> to generate the first duty corrected clock signal RE-C-DCC.

The second phase adjustment circuit 22 adjusts a duty cycle of the second input clock signal RE-N according to the plurality of delay control codes SHF<2:0>, SHS<1:0> and the plurality of phase mixing control codes R<6:1>, RB<6:1>, R-S0<7,0>, R-S1<7,0> to generate the second duty corrected clock signal RE-N-DCC.

The first phase adjustment circuit 21 includes a delay circuit 30 and a phase mixing circuit 40. The delay circuit 30 delays the first input clock signal RE-C according to the plurality of delay control codes SHF<2:0>, SHS<1:0> to generate a first clock signal FCLK and a second clock signal SCLK. The phase mixing circuit 40 mixes the first clock signal FCLK and the second clock signal SCLK according to the plurality of phase mixing control codes R<6:1>, RB<6:1>, R-S0<7,0>, R-S1<7,0> to generate the first duty corrected clock signal RE-C-DCC.

The second phase adjustment circuit 22 may be configured utilizing a similar circuit as included in the first phase adjustment circuit 21.

The divider circuit 50 divides the first duty corrected clock signal RE-C-DCC and the second duty corrected clock signal RE-N-DCC to generate multi-phase clock signals ICLK, IBCLK, QCLK, QBCLK. The multi-phase clock signals ICLK, IBCLK, QCLK, QBCLK include a first phase clock signal ICLK, a second phase clock signal IBCLK, a third phase clock signal QCLK, and a fourth phase clock signal QBCLK.

The divider circuit 50 divides the second duty corrected clock signal RE-N-DCC to generate the first phase clock signal ICLK and the second phase clock signal IBCLK. The divider circuit 50 divides the first duty corrected clock signal RE-C-DCC to generate the third phase clock signal QCLK and the fourth phase clock signal QBCLK. The divider circuit may divide by a factor such as two (2), four (4), eight (8), or other suitable factor for the input clock signals.

The phase difference detection circuit 60 detects phase differences between the first phase clock signal ICLK, the second phase clock signal IBCLK, the third phase clock signal QCLK, and the fourth phase clock signal QBCLK to generate a plurality of detection signals PDETC, PDETN. The plurality of detection signals PDETC, PDETN include a first detection signal PDETC and a second detection signal PDETN.

The phase difference detection circuit 60 detects a phase difference between the third phase clock signal QCLK and the fourth phase clock signal QBCLK to generate the first detection signal PDETC. The phase difference detection circuit 60 detects a phase difference between the first phase clock signal ICLK and the second phase clock signal IBCLK to generate the second detection signal PDETN. The first detect signal PDETC and the second detect signal PDETN are generated with opposite logic levels.

By repeating an operation including adjusting the plurality of phase mixing control codes R<6:1>, RB<6:1>, R-S0<7,0>, R-S1<7,0> by 1-bit unit, a duty of the first duty corrected clock signal RE-C-DCC approaches a target value of 50%, and when the plurality of phase mixing control codes R<6:1>, RB<6:1>, R-S0<7,0>, R-S1<7,0> are adjusted by 1-bit unit, the duty of the first duty corrected clock signal RE-C-DCC exceeds 50% or decreases to less than 50%. In other words, the amount of duty change of the first duty corrected clock signal RE-C-DCC caused by adjusting the plurality of phase mixing control codes R<6: 1>, RB<6:1>, R-S0<7,0>, R-S1<7,0> by 1-bit unit is larger than the difference between a current duty and a target duty of the first duty corrected clock signal RE-C-DCC, which is referred to as a bang-bang state. During the bang-bang state, the logic levels of the plurality of detection signals PDETC, PDETN repeat an alternating signal, for example, a high level transitioning to a low level and followed by a high level and so forth, or a low level transitioning to a high level and followed by a low level and so forth. Therefore, the duty control circuit 70 detects the bang-bang state when the plurality of detection signals PDETC, PDETN repeat a signal including a high level followed by a low level a predetermined quantity of times, for example, three times.

The duty control circuit 70 changes or adjusts values of the plurality of phase mixing control codes R<6:1>, RB<6:1>, R-S0<7,0>, R-S1<7,0> by a first unit according to the plurality of detection signals PDETC, PDETN until the bang-bang state of the value of the plurality of phase mixing control codes R<6:1>, RB<6:1>, R-S0<7,0>, R-S1<7,0> is detected. When the bang-bang state is detected, the value of the plurality of phase mixing control codes R<6:1>, RB<6:1>, R-S0<7,0>, R-S1<7,0> may be adjusted by a second unit smaller than the first unit. The duty control circuit 70 is configured to decrease the value of the plurality of control codes by the second unit when the value of the plurality of control codes at the time the bang-bang state is detected is increased by the first unit relative to a previous value. The duty control circuit 70 is configured to increase the value of the plurality of control codes by the second unit when the value of the plurality of control codes at the time the bang-bang state is detected is decreased by the first unit relative to a previous value.

The duty control circuit 70 adjusts the values of the plurality of phase mixing control codes R<6:1>, RB<6:1>, R-S0<7,0>, R-S1<7,0> maintain a complementary state of the plurality of phase mixing control codes R<6:1>, RB<6:1>, R-S0<7,0>, R-S1<7,0> according to the plurality of detection signals PDETC, PDETN until the bang-bang state of the value of the plurality of phase mixing control codes R<6:1>, RB<6:1>, R-S0<7,0>, R-S1<7,0> is detected. For example, the duty control circuit 70 adjusts values of half of the codes R<6:1>, R-S0<7,0> and values of the other half of the codes RB<6:1>, R-S1<7,0> to maintain complementary states between the two halves of the mixing control codes according to the plurality of detection signals PDETC and PDETN until the bang-bang state is detected.

The duty control circuit 70 adjusts the value of at least one code bit of the plurality of phase mixing control codes R<6:1>, RB<6:1>, R-S0<7,0>, R-S1<7,0> independently of unadjusted code bits when the bang-bang state is detected.

The duty control circuit 70 adjusts the values of the plurality of phase mixing control codes R<6:1>, RB<6:1>, R-S0<7,0>, R-S1<7,0> by the first unit as the duty control circuit 70 adjusts the values of the plurality of phase mixing control codes R<6:1>, RB<6:1>, R-S0<7,0>, R-S1<7,0> to maintain a complementary state. The duty control circuit 70 adjusts the values of the plurality of phase mixing control codes R<6:1>, RB<6:1>, R-S0<7,0>, R-S1<7,0> by a second unit as the duty control circuit 70 adjusts the values of at least one of the plurality of phase mixing control codes R<6:1>, RB<6:1>, R-S0<7,0>, R-S1<7,0>, for example, the second phase mixing control code set R-S0<7,0>, R-S1<7,0> independently of unadjusted code bits R<6:1> and RB<6:1>.

The duty control circuit 70 performs an operation referred to as a "training operation" including adjusting the value of the plurality of control codes SHF<2:0>, SHS<1:0>, R<6:1>, RB<6:1>, R-S0<7,0>, R-S1<7,0> according to an internally determined timing and/or an external request, such as a request originating external to the circuit in which the duty cycle correction circuit 10 is disposed, such as a memory control circuit 605, a data input/output circuit 604, a semiconductor circuit 600, or a device external to the semiconductor circuit 600. The time at which the training operation is performed may be determined by control signals CTRLS.

Figure 2:
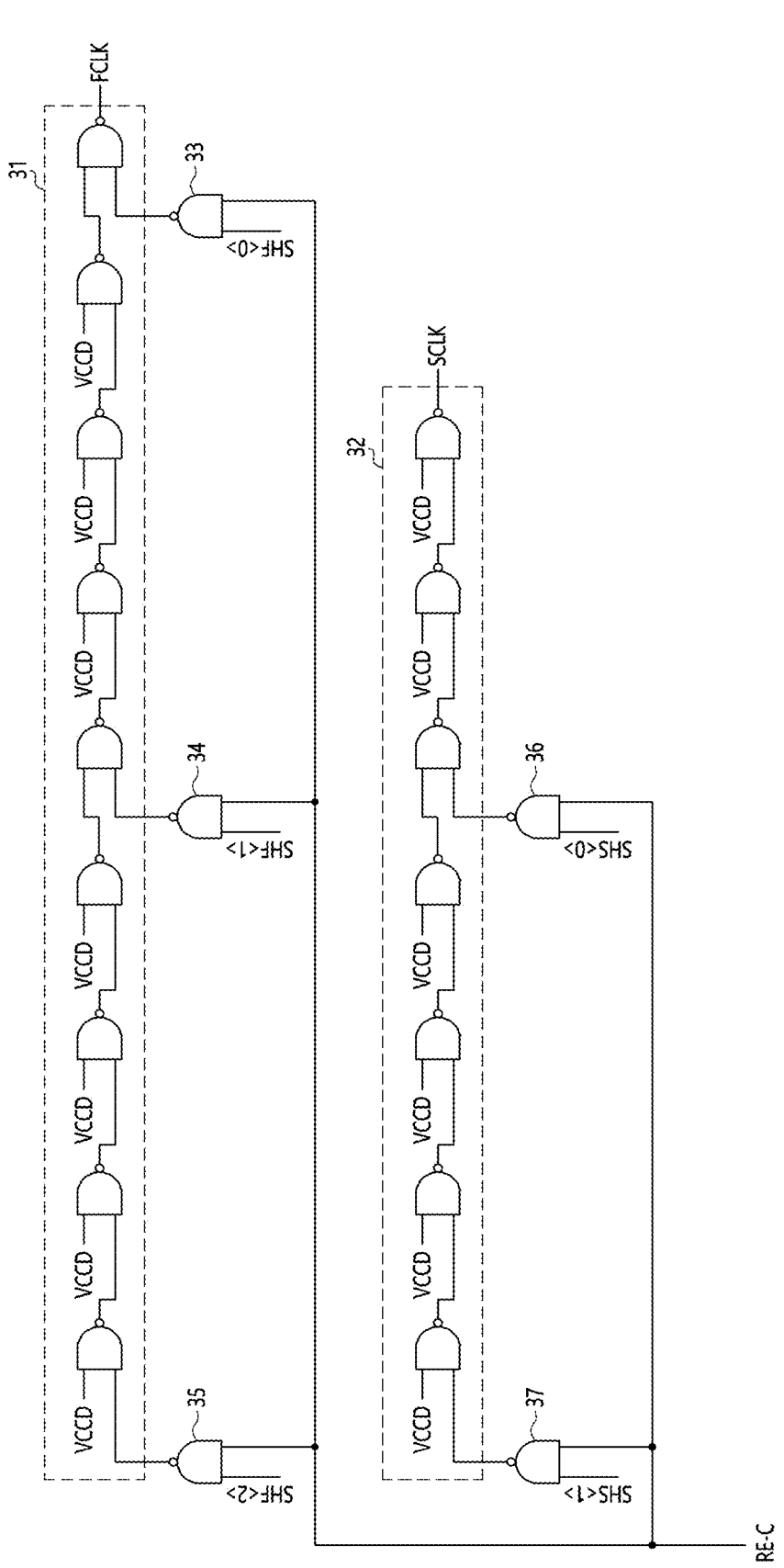
FIG. 2 is a diagram illustrating a configuration of a delay circuit according to an embodiment of the present disclosure.

FIG. 2 is a diagram illustrating a configuration of the delay circuit 30, for example, as shown in FIG. 1.

Referring to FIG. 2, the delay circuit 30 includes a first delay line or path 31, a second delay line or path 32, and a plurality of switches 33 through 37.

The first delay line 31 delays the first input clock signal RE-C by a variable first delay time and outputs a delayed signal as a first clock signal FCLK. The first delay line 31 includes a plurality of logic gates coupled in series, such as a plurality of NAND gates each including a first input terminal to which a power supply voltage VCCD is applied and a second input terminal that receives an output signal from a previous logic gate in the series of logic gates.

Among the plurality of switches 33 to 37, the first switch 33, the second switch 34, and the third switch 35 adjust the first delay time, in this example, the quantity of NAND gates among the NAND gates of the first delay line 31 through which the first input clock signal RE-C passes according to the first delay control code SHF<2:0>.

The second delay line 32 delays the first input clock signal RE-C by a variable second delay time and outputs a delayed signal as a second clock signal SCLK. The second delay line 32 includes a plurality of logic gates coupled in series, such as a plurality of NAND gates each including a first input terminal to which a power supply voltage VCCD is applied and a second input terminal that receives an output signal from a previous logic gate in the series of logic gates. The second delay line 32 has a smaller delay time than the first delay line 31.

The fourth switch 36 and the fifth switch 37 of the plurality of switches 33 to 37 adjust the second delay time, in this example, the quantity of NAND gates among the NAND gates of the second delay line 32 through which the first input clock signal RE-C passes according to the second delay control code SHS<1:0>.

By designing the first delay line 31 and the second delay line 32 such that a different quantity of logic gates are selected from each of the first delay line 31 and the second delay line 32, the first clock signal FCLK and the second clock signal SCLK may always have a delay time difference of more than a predetermined value (for example, the delay time by two NAND gates).

The training operation as described is performed by adjusting the value of the plurality of delay control codes SHF<2:0>, SHS<1:0> applied to the delay circuit 30 of the first phase adjustment circuit 21 while keeping the values of the plurality of delay control codes SHF<2:0>, SHS<1:0> applied to the delay circuit 30 of the second phase adjustment circuit 22 fixed.

Figure 3:
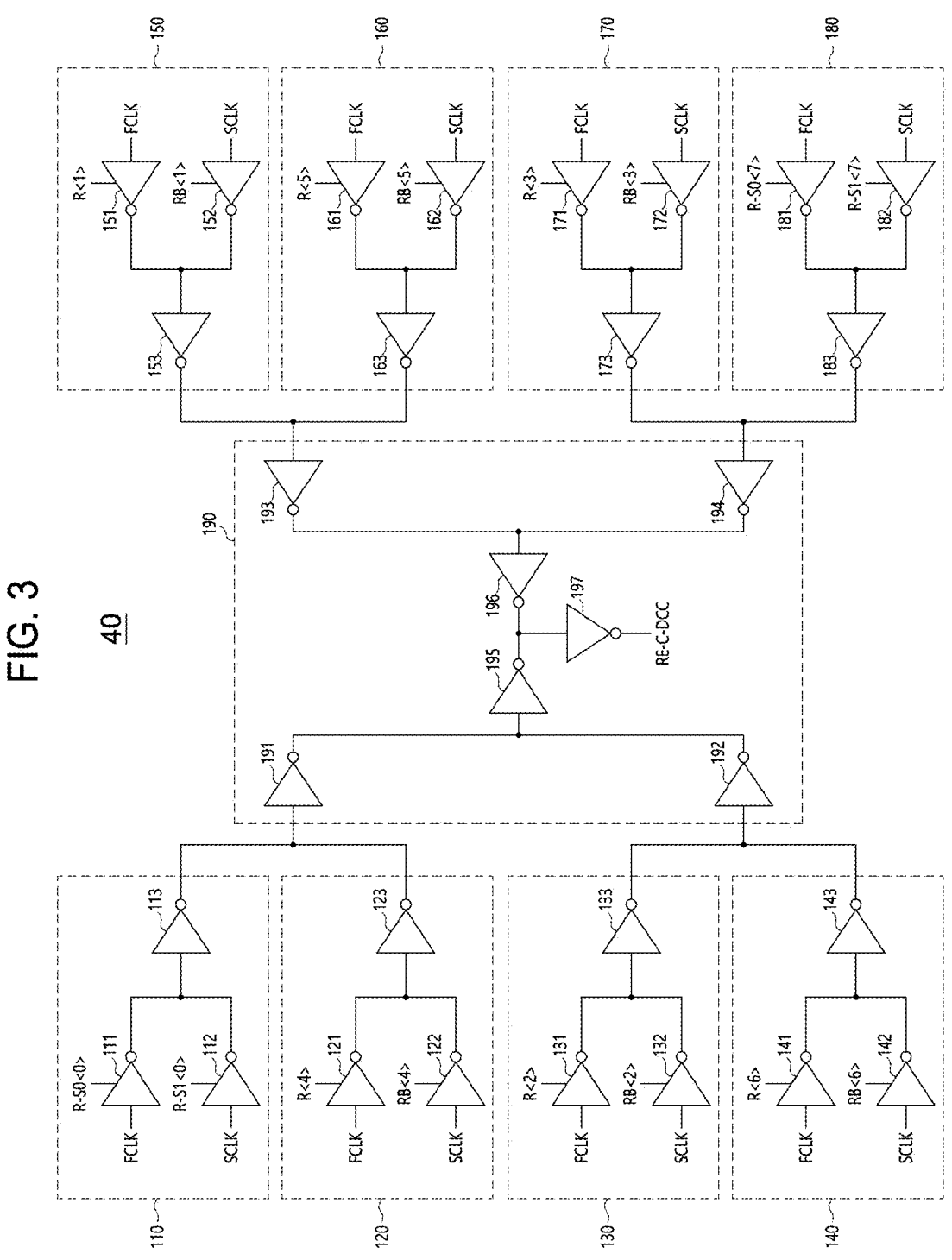
FIG. 3 is a diagram illustrating a configuration of a phase mixing circuit according to an embodiment of the present disclosure.

FIG. 3 is a diagram illustrating a configuration of the phase mixing circuit 40, for example, as shown in FIG. 1.

Referring to FIG. 3, the phase mixing circuit 40 includes a plurality of preliminary circuits 110, 120, 130, 140, 150, 160, 170 180 and a main circuit 190.

The plurality of preliminary circuits 110 to 180 outputs at least one of a first clock signal FCLK and a second clock signal SCLK according to a different pair of codes among a plurality of phase mixing control codes R<6:1>, RB<6:1>, R-S0<7,0>, R-S1<7,0>.

A first group including at least one of the plurality of preliminary circuits 110 to 180 selects and outputs both the first clock signal FCLK and the second clock signal SCLK according to the second phase mixing control code set R-S0<7,0>, R-S1<7,0>. Circuits other than the at least one of the plurality of preliminary circuits 110 to 180, in this example, a second group excluding the first group, selects and outputs one of the first clock signal FCLK and the second clock signal SCLK according to the first phase mixing control code set R<6:1>, RB<6:1>.

The first group of the plurality of preliminary circuits 110 to 180 includes at least one of the first preliminary circuit 110 and the eighth preliminary circuit 180 corresponding to a least significant bit and a most significant bit, respectively, of the plurality of phase mixing control codes R<6:1>, RB<6:1>, R-S0<7,0>, R-S1<7,0>.

The second group of the plurality of preliminary circuits 110 to 180 includes the second preliminary circuit 120 to the seventh preliminary circuit 170 corresponding to bits other than the least significant bit and the most significant bit of the plurality of phase mixing control codes R<6:1>, RB<6:1>, R-S0<7,0>, R-S1<7,0>.

Referring to FIG. 3, the first preliminary circuit 110 to the fourth preliminary circuit 140 on the left side of the drawing each receive input of a different pair of even-ordered phase mixing control codes R-S0<0>, R-S1<0>/R<4>, RB<4>/R<2>, RB<2>/R<6>, RB<6>. The first preliminary circuit 110 to the fourth preliminary circuit 140 operate in response to the phase mixing control codes R-S0<0>, R-S1<0>/R<4>, RB<4>/R<2>, RB<2>/R<6>, RB<6>. The fifth preliminary circuit 150 to the eighth preliminary circuit 180 on the right side of the drawing each receive input of a different pair of odd-ordered phase mixing control codes R-S0<1>, R-S1<1>/R<5>, RB<5>/R<3>, RB<3>/R<7>, RB<7>. The fifth preliminary circuit 150 to the eighth preliminary circuits 180 operate in response to the phase mixing control codes R-S0<1>, R-S1<1>/R<5>, RB<5>/R<3>, RB<3>/R<7>, RB<7>.

The first preliminary circuit 110 include a first tri-state inverter 111, a second tri-state inverter 112, and an inverter 113. The first tri-state inverter 111 inverts and outputs the first clock signal FCLK when the second phase mixing control code R-S0<0> is at a high level. The second tri-state inverter 112 inverts and outputs the second clock signal SCLK when the second phase mixing control code R-S1<0> vis at a high level. The inverter 113 inverts a logic level of the node to which the outputs of the first tri-state inverter 111 and the second tri-state inverter 112 are coupled. The inverter 113 outputs by mixing and inverting the phases of the first clock signal FCLK and the second clock signal SCLK when both of the second phase mixing control codes R-S0<0>, R-S1<0> are at a high level and outputs by inverting one of the first clock signal FCLK and the second clock signal SCLK when only one of the second phase mixing control codes R-S0<0>, R-S1<0> is at a high level.

The eighth preliminary circuit 180 includes a first tri-state inverter 181, a second tri-state inverter 182, and an inverter 183. The first tri-state inverter 181 inverts and output the first clock signal FCLK when the second phase mixing control code R-S0<7> is at a high level. The second tri-state inverter 182 inverts and outputs the second clock signal SCLK when the second phase mixing control code R-S1<7> is at a high level. The inverter 183 inverts a logic level of the node to which the outputs of the first tri-state inverter 181 and the second tri-state inverter 182 are coupled. The inverter 183 outputs by mixing and inverting the phases of the first clock signal FCLK and the second clock signal SCLK when both of the second phase mixing control codes R-S0<7>, R-S1<7> are at a high level and outputs by inverting one of the first clock signal FCLK and the second clock signal SCLK when one of the second phase mixing control codes R-S0<7>, R-S1<7> is at a high level.

The second preliminary circuit 120 to the seventh preliminary circuits 170 may be configured utilizing a similar circuit configuration as included in the first preliminary circuit 110, differing by terms of the operation of selecting one of the first clock signal FCLK and the second clock signal SCLK in response to the first phase mixing control code set R<6:1>, RB<6:1> and inverting and outputting the selected signal.

The main circuit 190 outputs a first duty corrected clock signal RE-C-DCC that is a mixture of the outputs of the plurality of preliminary circuits 110 to 180. The main circuit 190 includes a plurality of inverters 191 to 197. The first inverter 191 mixes and inverts an output of the first preliminary circuit 110 and an output of the second preliminary circuit 120. The second inverter 192 mixes and inverts an output of the third preliminary circuit 130 and an output of the fourth preliminary circuit 140. The third inverter 193 mixes and inverts an output of the fifth preliminary circuit 150 and an output of the sixth preliminary circuit 160. The fourth inverter 194 mixes and inverts an output of the seventh preliminary circuit 170 and an output of the eighth preliminary circuit 180. The fifth inverter 195 mixes and inverts an output of the first inverter 191 and an output of the second inverter 192. The sixth inverter 196 mixes and inverts an output of the third inverter 193 and an output of the fourth inverter 194. The seventh inverter 197 mixes and inverts an output of the fifth inverter 195 and an output of the sixth inverter 196 and outputs the first duty corrected clock signal RE-C-DCC.

The phase mixing circuit 40 adjust the codes R-S0<7,0>, R<6:1> to be complimentary to the codes R-S1<7,0>, RB<6:1> by a first unit such that the plurality of preliminary circuits 110 to 180 operate by selecting one of the first clock signal FCLK and the second clock signal SCLK. Adjusting a code value by the first unit is accomplished by increasing or decreasing the quantity of code bits having a value of 1. As the value of the codes R-S0<7,0>, R<6:1> is adjusted by the first unit, in this example, by 1-bit, an absolute value of the quantity of clock signals used for phase mixing does not change, but the quantity of one of the first clock signal FCLK and the second clock signal SCLK used for phase mixing decreases and the quantity of the other increases, such that the phase mixing circuit 40 operates at a predetermined resolution, for example, a first resolution.

By independently adjusting a value of the second phase mixing control code set R-S0<7,0>, R-S1<7,0>, a value of the plurality of phase mixing control codes R<6:1>, RB<6:1>, R-S0<7,0>, R-S1<7,0> is adjusted by a second unit. When the value of the second phase mixing control code set R-S0<7,0>, R-S1<7,0> is adjusted independently, for example, when the codes R-S0<7>, R-S1<7> simultaneously have a value of 1, as the eighth preliminary circuit 180 selects both the first clock signal FCLK and the second clock signal SCLK, the absolute value of the quantity of clock signals used for phase mixing changes, thereby facilitating or enabling the phase mixing circuit 40 to operate at a second resolution that is twice as high as the first resolution.

Because the phase mixing circuit 40 is operated at the first resolution by 1-bit unit adjustment as described, the second unit adjustment that operates the phase mixing circuit 40 at the second resolution that is twice as high as the first resolution corresponds to a 0.5-bit unit adjustment.

Figure 4:
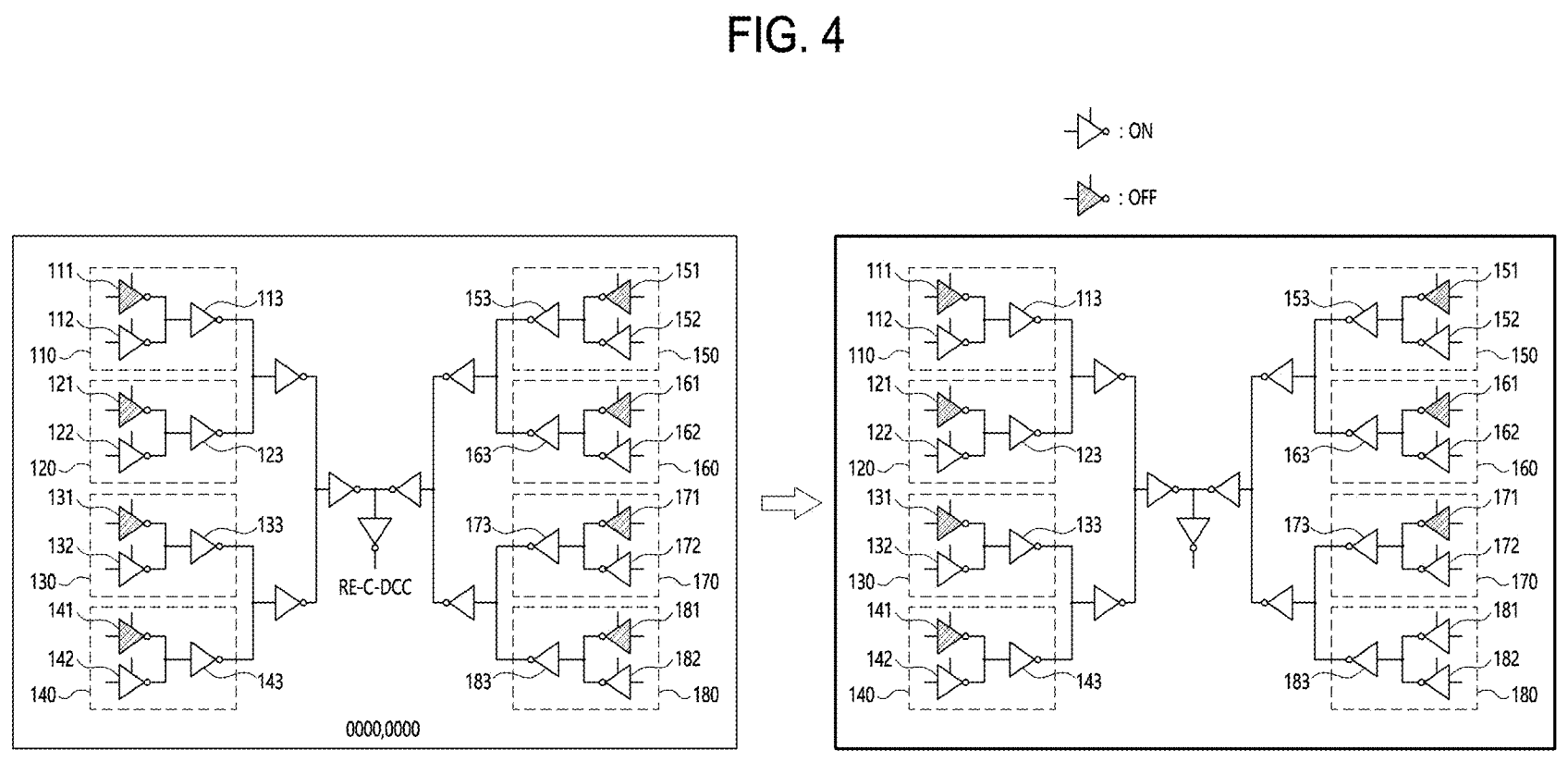

FIG. 4 is a diagram illustrating a duty cycle correction scheme according to an embodiment of the present disclosure.

The duty cycle correction circuit 10 adjusts the values of the codes R-S0<7,0>, R<6:1> to be complementary to the codes R-S1<7,0>, RB<6:1> by 1-bit unit until a bang-bang state is detected.

Referring to FIG. 4, when the codes R-S0<7>, R<6:1>, R-S0<0> are adjusted from "00000000" to "00000001" by 1-bit, the codes R-S1<7>, RB<6:1>, R-S1<0> are adjusted from "11111111" to "11111110" in a complementary state with respect to the codes R-S0<7>, R<6:1>, R-S0<0>. The phase mixing circuit 40 turns on the tri-state inverters 111, 122, 132, 142, 152, 162, 172, 182 receiving the codes R-S1<7>, RB<6:1>, R-S0<0> from the plurality of preliminary circuits 110 to 180 to select a corresponding signal from the first clock signal FCLK and the second clock signal SCLK. Thus, the phase mixing circuit 40 performs a phase mixing operation by selecting one first clock signal FCLK and seven second clock signals SCLK.

When the codes R-S0<7>, R<6:1>, R-S0<0> are adjusted by 1-bit from 00000001 to 00000000, the codes R-S1<7>, RB<6:1>, R-S1<0> are adjusted from 11111110 to 11111111, which codes are complementary to the codes R-S0<7>, R<6:1>, R-S0<0>. The phase mixing circuit 40 turns on the tri-state inverters 112, 122, 132, 142, 152, 162, 172, 182 that receive the codes R-S1<7>, RB<6:1>, R-S1<0> from the plurality of preliminary circuits 110 to 180 and selects a corresponding signal corresponding from the first clock signal FCLK and the second clock signal SCLK. Thus, the phase mixing circuit 40 selects eight second clock signals SCLK to perform phase mixing operation.

The duty cycle correction circuit 10 detects a bang-bang state during the iterative process of adjusting the code values of the first phase mixing control code set R<6:1>, RB<6:1> and the second phase mixing control code set R-S0<7,0>, R-S1<7,0> by 1-bit. The duty control circuit 10 is configured to adjust a value of at least one code bit of the plurality of phase mixing control codes to be a value between an upper value and a lower value of the plurality of phase mixing control codes when the bang-bang state is detected. The upper value may be, for example, the highest value including eight bits, 11111111, and the lower value may be, for example, the lowest value including eight bits, 00000000.

When the duty cycle correction circuit 10 detects the bang-bang state, the duty cycle correction circuit 10 independently adjusts the value of the second phase mixing control code set R-S0<7,0>, R-S1<7,0> according to a logic level of the first detection signal PDETC with the value of the first phase mixing control code set R<6:1>, RB<6:1>, R-S0<7,0>, R-S1<7,0> fixed or settled, such that the value of the plurality of phase mixing control codes R<6:1>, RB<6:1>, R-S0<7,0>, R-S1<7,0> is adjusted by a value corresponding to 0.5 bit.

When the code set R-S0<7>, R<6:1>, R-S0<0> at the time the bang-bang state detected is, for example, 00000000, the duty cycle correction circuit 10 changes a value of one of the second phase mixing control code set R-S0<7,0>, R-S1<7,0>, for example, a value of the code R-S0<7> to 1, such that the value of the codes R-S0<7>, R<6:1>, R-S0<0> is 10000000 that is adjusted by 0.5 bit. The phase mixing circuit 40 turns on the tri-state inverters 112, 122, 132, 142, 152, 162, 172, 182 that receive the codes R-S0<7>, R-S1<7>, RB<6:1>, R-S1<0> from the plurality of preliminary circuits 110 to 180 and select a corresponding signal from the first clock signal FCLK and the second clock signal SCLK. Thus, the phase mixing circuit 40 performs a phase mixing operation by selecting nine clock signals, in this example, one first clock signal FCLK and eight second clock signals SCLK, compared to the example when the value of the codes R-S0<7>, R<6:1>, R-S0<0> is "00000000".

The example is only one example when the value of the codes R-S0<7>, R<6:1>, R-S0<0> is 00000000 at the time the bang-bang state is detected, and information about the value of the second phase mixing control code set R-S0<7, 0>, R-S1<7,0> to be adjusted according to the value of the codes R-S0<7,0>, R-S0<0> may be pre-stored in the duty cycle correction circuit 10 as adjustment code information.

The duty cycle correction circuit 10 performs the training operation by adjusting the value of the second phase mixing control code set R-S0<7>, R<6:1>, R-S0<0> to match the value of the codes R-S0<7,0>, R-S1<7,0> at the time the bang-bang state is detected according to the pre-stored adjustment code information.

Figure 5:
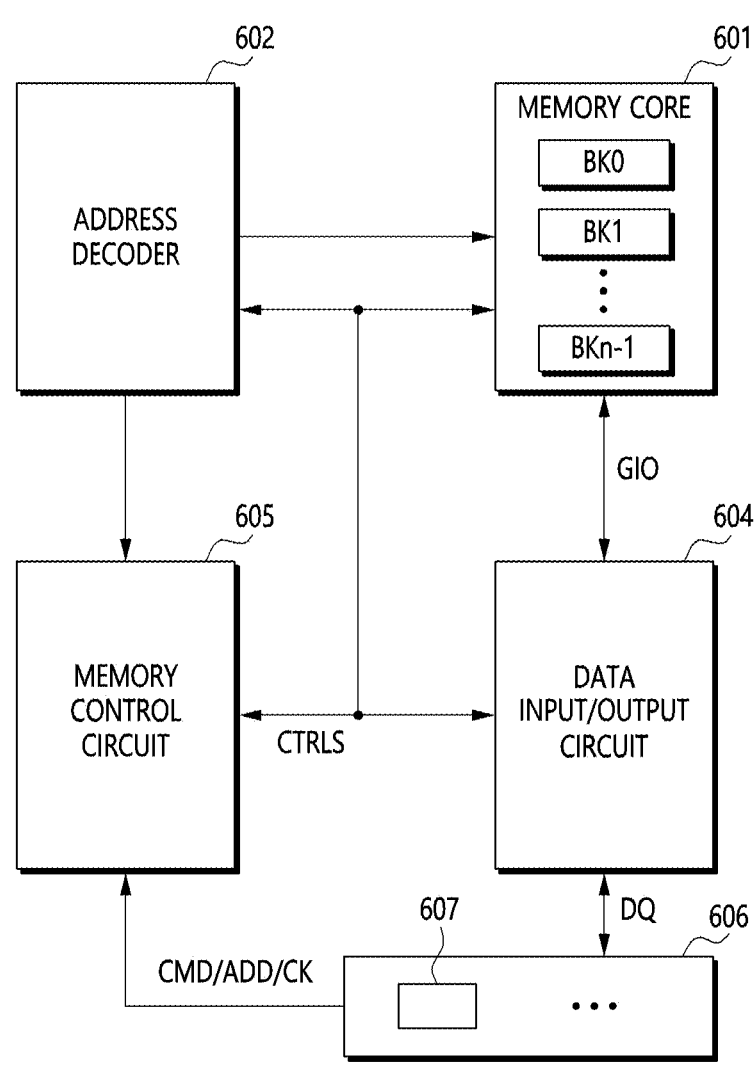
FIG. 5 is a diagram illustrating a configuration of a semiconductor apparatus according to an embodiment of the present disclosure.

FIG. 5 is a diagram illustrating a configuration of a semiconductor apparatus 600 according to an embodiment of the present disclosure.

Referring to FIG. 5, the semiconductor apparatus 600 according to an embodiment of the present disclosure includes a memory core 601, an address decoder 602, a data input/output circuit 604, a memory control circuit 605, and an input/output pad circuit 606.

The duty cycle correction circuit 10 according to an embodiment of the present disclosure may be included in the data input/output circuit 604 or the memory control circuit 605.

The memory core 601 includes a plurality of unit cells, and the plurality of unit cells comprise at least one of a volatile memory and a non-volatile memory. The volatile memory may include static RAM (SRAM), dynamic RAM (DRAM), and synchronous DRAM (SDRAM), and the non-volatile memory may include read only memory (ROM) and programmable ROM (PROM), EEPROM (Electrically Erase and Programmable ROM), EPROM (Electrically Programmable ROM), flash memory, PRAM (Phase change RAM), MRAM (Magnetic RAM), RRAM (Resistive RAM), and FRAM (Ferroelectric RAM). The unit cells of the memory core 601 are divided into a plurality of memory regions, such as a plurality of memory banks BK0 through BKn−1, referred to as "banks".

The address decoder 602 is coupled to the memory control circuit 605 and the memory core 601. The address decoder 602 decodes an address signal provided by the memory control circuit 605 and accesses the memory core 601 in response to the decoding result.

The data input/output circuit 604 is coupled to memory core 601 through a global input/output line GIO. The data input/output circuit 604 exchanges data with a system external to the semiconductor apparatus 600 or the memory core 601.

The memory control circuit 605 is coupled to the memory core 601, the address decoder 602, and the data input/output circuit 604. The memory control circuit 605 is provided with commands CMD, addresses ADD, and clock signals CK. The memory control circuit 605 provides an address decoded through the address decoder 602 to the data input/output circuit 604. The memory control circuit 605 controls the test operation and the normal operation of the semiconductor apparatus 600. The normal operation includes a read operation, a write operation, and an address processing operation.

The memory control circuit 605 controls the training operation of the duty cycle correction circuit 10. The memory control circuit 605 provides control signals CTRLS to the duty cycle correction circuit 10 in response to training request instructions requested from an external system, such as a memory controller.

The input/output pad circuit 606 includes a plurality of pads 607 that receive commands CMD, addresses ADD, and clock signals CK, and that input and output data DQ. The pads for inputting and outputting data DQ are referred to as a plurality of data input/output pads. Data provided by a host may be input through any of the plurality of data input/output pads.

Various embodiments of the present disclosure may improve operational performance of the duty cycle correction circuit by increasing resolution without increasing circuit area and power consumption.

A person skilled in the art to which the present disclosure pertains can understand that the present disclosure may be carried out in other specific forms without changing the technical spirit or essential features. Therefore, the embodiments described are illustrative in all aspects, not limitative. All changes within the meaning and range of equivalency of the claims are included within their scope.

What is claimed is:

1. A duty cycle correction circuit comprising:
a phase adjustment circuit configured to adjust a duty cycle of a first input clock signal according to a plurality of control codes to generate a duty corrected clock signal;
a divider circuit configured to divide the duty corrected clock signal to generate a plurality of multi-phase clock signals;
a phase difference detection circuit configured to detect phase differences between the plurality of multi-phase clock signals to generate detection signals; and
a duty control circuit configured to detect a bang-bang state of the duty corrected clock signal in accordance with the detection signals, configured to change values of the plurality of control codes by a first unit in accordance with the detection signals until the bang-bang state is detected, and configured to adjust the values of the plurality of control codes by a second unit smaller than the first unit when the bang-bang state is detected.

2. The duty cycle correction circuit of claim 1,
wherein the duty control circuit is configured to decrease the value of the plurality of control codes by the second unit when the value of the plurality of control codes at the time the bang-bang state is detected is increased by the first unit relative to a previous value, and configured to increase the value of the plurality of control codes by the second unit when the value of the plurality of control codes at the time the bang-bang state is detected is decreased by the first unit relative to a previous value.

3. The duty cycle correction circuit of claim 1, wherein the phase adjustment circuit comprises:
a delay circuit configured to delay the first input clock signal to generate a first clock signal and a second clock signal according to a plurality of delay control codes among the plurality of control codes; and
a phase mixing circuit configured to mix the first clock signal and the second clock signal to generate the duty corrected clock signal according to a plurality of phase mixing control codes among the plurality of control codes.

4. The duty cycle correction circuit of claim 3, wherein the delay circuit comprises:

a first delay path configured to delay the first input clock signal according to a first delay control code among the plurality of delay control codes to generate the first clock signal; and
a second delay path configured to delay the first input clock signal according to a second delay control code among the plurality of delay control codes to generate the second clock signal.

5. The duty cycle correction circuit of claim 3, wherein the phase mixing circuit comprises:
a plurality of preliminary circuits configured to select and output at least one of the first clock signal and the second clock signal according to a different pair of codes among the plurality of phase mixing control codes; and
a main circuit configured to output the duty corrected clock signal by mixing outputs of the plurality of preliminary circuits.

6. The duty cycle correction circuit of claim 3, wherein the phase mixing circuit comprises:
a plurality of preliminary circuits; and
a main circuit configured to output the duty corrected clock signal by mixing outputs of the plurality of preliminary circuits;
wherein at least one of the plurality of preliminary circuits is configured to select and output the first clock signal and the second clock signal according to a second phase mixing control code set among the plurality of phase mixing control codes, and circuits other than the at least one of the plurality of preliminary circuits are configured to select and output one of the first clock signal and the second clock signal according to a first phase mixing control code set among the plurality of phase mixing control codes.

7. The duty cycle correction circuit of claim 6,
wherein at least one of a most significant bit and a least significant bit of the plurality of phase mixing control codes is used as the second phase mixing control code set.

8. A duty cycle correction circuit comprising:
a phase mixing circuit configured to select at least one of a first clock signal and a second clock signal according to a different code set from a plurality of phase mixing control codes, and configured to mix selected signals to output a duty corrected clock signal;
a divider circuit configured to divide the duty corrected clock signal to generate a plurality of multi-phase clock signals;
a phase difference detection circuit configured to detect phase differences between the plurality of multi-phase clock signals to generate detection signals; and
a duty control circuit configured to detect a bang-bang state of the duty corrected clock signal in accordance with the detection signals, configured to adjust values of the plurality of phase mixing control codes to maintain a complementary state among the plurality of phase mixing control codes in accordance with the detection signals until the bang-bang state is detected, and configured to adjust a value of at least one code bit among the plurality of phase mixing control codes independently of remaining code bits when the bang-bang state is detected.

9. The duty cycle correction circuit of claim 8, further comprising a delay circuit configured to delay a first input clock signal according to a plurality of delay control codes to generate the first clock signal and the second clock signal.

10. The duty cycle correction circuit of claim 9, wherein the delay circuit comprises:

a first delay path configured to delay the first input clock signal according to a first delay control code among the plurality of delay control codes to generate the first clock signal; and a second delay path configured to delay the first input clock signal according to a second delay control code among the plurality of delay control codes to generate the second clock signal.

11. The duty cycle correction circuit of claim 8, wherein the phase mixing circuit comprises:

a plurality of preliminary circuits; and a main circuit configured to output the duty corrected clock signal by mixing outputs of the plurality of preliminary circuits;

wherein at least one of the plurality of preliminary circuits is configured to select and output the first clock signal and the second clock signal according to a second phase mixing control code set among the plurality of phase mixing control codes, and circuits other than at the least one of the plurality of preliminary circuits are configured to select and output one of the first clock signal and the second clock signal according to a first phase mixing control code set among the plurality of phase mixing control codes.

12. The duty cycle correction circuit of claim 11, wherein at least one of a most significant bit and a least significant bit of the plurality of phase mixing control codes is used as the second phase mixing control code set.

13. The duty cycle correction circuit of claim 8, wherein the duty control circuit is configured to adjust a value of at least one code bit of the plurality of phase mixing control codes to be a value between an upper value and a lower value of the plurality of phase mixing control codes when the bang-bang state is detected.

14. A duty cycle correction circuit comprising:

a first phase adjustment circuit configured to adjust a duty cycle of a first input clock signal according to a plurality of delay control codes and a plurality of phase mixing control codes to generate a first duty corrected clock signal;

a second phase adjustment circuit configured to adjust a duty cycle of a second input clock signal according to the plurality of delay control codes and the plurality of phase mixing control codes to generate a second duty corrected clock signal;

a divider circuit configured to divide the first duty corrected clock signal and the second duty corrected clock signal to generate multi-phase clock signals;

a phase difference detection circuit configured to detect phase differences between the multi-phase clock signals to generate detection signals; and a duty control circuit configured to detect a bang-bang state in accordance with the detection signals, configured to change values of the plurality of phase mixing control codes by a first unit in accordance with the detection signals until the bang-bang state is detected, and configured to adjust the values of the plurality of phase mixing control codes by a second unit less than the first unit when the bang-bang state is detected.

15. The duty cycle correction circuit of claim 14, wherein the first phase adjustment circuit comprises:

a delay circuit configured to delay the first input clock signal to generate a first clock signal and a second clock signal according to the plurality of delay control codes; and a phase mixing circuit configured to mix the first clock signal and the second clock signal to generate the first duty corrected clock signal according to the plurality of phase mixing control codes.

16. The duty cycle correction circuit of claim 15, wherein the phase mixing circuit comprises:

a plurality of preliminary circuits; and a main circuit configured to output the first duty corrected clock signal by mixing outputs of the plurality of preliminary circuits, wherein at least one of the plurality of preliminary circuits is configured to select and output the first clock signal and the second clock signal according to a second phase mixing control code set among the plurality of phase mixing control codes, and circuits other than the at least one of the plurality of preliminary circuits are configured to select and output one of the first clock signal and the second clock signal according to a first phase mixing control code set among the plurality of phase mixing control codes.

17. The duty cycle correction circuit of claim 16, wherein at least one of a most significant bit and a least significant bit of the plurality of phase mixing control codes is used as the second phase mixing control code set.

18. The duty cycle correction circuit of claim 14, wherein the duty control circuit is configured to decrease the value of the plurality of phase mixing control codes by the second unit when the value of the plurality of phase mixing control codes at the time the bang-bang state is detected is increased by the first unit relative to a previous value, and configured to increase the value of the plurality of phase mixing control codes by the second unit when the value of the plurality of phase mixing control codes at the time the bang-bang state is detected is decreased by the first unit relative to a previous value.

19. The duty cycle correction circuit of claim 14, wherein the duty control circuit is configured to adjust a value of codes applied to the first phase adjustment circuit among the plurality of delay control codes while holding fixed a value of codes applied to the second phase adjustment circuit among the plurality of delay control codes.

* * * * *